(12) United States Patent
Inaba et al.

(10) Patent No.: US 9,812,431 B2
(45) Date of Patent: *Nov. 7, 2017

(54) POWER SEMICONDUCTOR MODULE

(71) Applicant: Fuji Electric Co., Ltd., Kanagawa (JP)

(72) Inventors: Tetsuya Inaba, Nagano (JP); Yoshinari Ikeda, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/672,467

(22) Filed: Mar. 30, 2015

(65) Prior Publication Data

US 2015/0279753 A1 Oct. 1, 2015

(30) Foreign Application Priority Data

Apr. 1, 2014 (JP) .................................. 2014-075640

(51) Int. Cl.
*H01L 25/07* (2006.01)
*H01L 23/049* (2006.01)
(Continued)

(52) U.S. Cl.
CPC .......... *H01L 25/072* (2013.01); *H01L 23/049* (2013.01); *H01L 23/492* (2013.01);
(Continued)

(58) Field of Classification Search
CPC .............. H01L 23/538; H01L 23/5383; H01L 23/5384; H01L 23/5389; H01L 23/31;
(Continued)

(56) References Cited

U.S. PATENT DOCUMENTS 5,591,993 A    1/1997  Nomura et al.
5,629,562 A    5/1997  Nomura et al.
(Continued)

FOREIGN PATENT DOCUMENTS

| JP | H1-122146 A | 5/1989 | |
|----|----|----|----|
| JP | 5083226 B | * 11/1993 | ............. H01L 24/01 |
| JP | H6-295965 A | 10/1994 | |
| JP | H7-312410 A | 11/1995 | |
| JP | H10-294421 A | 11/1998 | |
| JP | 2004-228403 A | 8/2004 | |
| JP | 2007-287833 A | 11/2007 | |
| JP | 2010-165764 A | 7/2010 | |
| JP | 2012-74730 A | 4/2012 | |
| JP | 2013-149762 A | 8/2013 | |

OTHER PUBLICATIONS

JP 5083226—Electronic English Translation.*
U.S. Appl. No. 14/695,276, filed Apr. 24, 2015.

*Primary Examiner* — Jose R Diaz

(74) *Attorney, Agent, or Firm* — Chen Yoshimura LLP

(57) ABSTRACT

A power semiconductor module is equipped with: a metal base; semiconductor chips electrically connected with and fixed to the metal base; and an insulating substrate fixed to the metal base and having a circuit plate on one surface. Additionally, the power semiconductor module is further equipped with a circuit board that is provided so as to face the semiconductor chips and the insulating substrate and that electrically connects electrodes of the semiconductor chips and the circuit plate of the insulating substrate. Further, the power semiconductor module is equipped with a conductive post that is electrically connected to at least one of either the electrodes of the semiconductor chips or the circuit plate of the insulating substrate while being electrically connected to the metal film of the circuit board.

8 Claims, 3 Drawing Sheets

(51) Int. Cl.
*H01L 23/492* (2006.01)
*H01L 23/498* (2006.01)
H01L 23/24 (2006.01)
H01L 23/373 (2006.01)

(52) U.S. Cl.
CPC ........ *H01L 23/49811* (2013.01); *H01L 23/24* (2013.01); *H01L 23/3735* (2013.01); *H01L 2224/48091* (2013.01); *H01L 2224/48227* (2013.01)

(58) Field of Classification Search
CPC ..... H01L 23/3121; H01L 24/40; H01L 24/41; H01L 24/49; H01L 25/072; H01L 23/492; H01L 23/49811; H01L 23/49822; H01L 23/049
See application file for complete search history.

(56) References Cited

U.S. PATENT DOCUMENTS

| | | | |
|---|---|---|---|
| 8,354,740 B2* | 1/2013 | Liu | H01L 23/49524 257/675 |
| 9,209,099 B1* | 12/2015 | Hori | H01L 23/043 |
| 2005/0023670 A1 | 2/2005 | Hata et al. | |
| 2011/0222717 A1 | 9/2011 | Kuratani et al. | |
| 2013/0127295 A1 | 5/2013 | Jun et al. | |
| 2014/0203306 A1 | 7/2014 | Ito | |

* cited by examiner

POWER SEMICONDUCTOR MODULE

BACKGROUND OF THE INVENTION

Technical Field

The present invention relates to a power semiconductor module.

Background Art

Power semiconductor modules used as semiconductor devices are roughly categorized into insulated power semiconductor modules and non-insulated power semiconductor modules. A non-insulated power semiconductor module is a power semiconductor module that does not independently have an insulating function; instead, a device on which the non-insulated power semiconductor module is installed is equipped with an insulating function and serves the insulating function of the power semiconductor module. A non-insulated power semiconductor module is particularly employed for a device that requires low inductance. Non-insulated power semiconductor modules are described in Patent Document 1, Patent Document 2, and Patent Document 3.

FIGS. 4 and 5 respectively show a plan view and a cross-sectional view of an example of a non-insulated power semiconductor module.

A power semiconductor module 101 shown in FIGS. 4 and 5 is equipped with a metal base 2, which serves as a conductive plate.

Semiconductor chips 3, which serve as semiconductor elements, are electrically connected and fixed on the metal base 2. In the illustrated example, a plurality of semiconductor chips 3 are provided on the metal base 2. A drain electrode formed on the bottom surface of each of the semiconductor chips 3 is joined to the metal base 2 by a joining material not shown in the diagram, such as solder.

In addition to the semiconductor chips 3, a multilayer substrate 4 is joined on the metal base 2. The multilayer substrate 4 is constituted by: an insulating plate 41; a metal plate 42 provided on one surface of the insulating plate 41 and joined to the multilayer substrate by a joining material not shown in the diagram, such as solder; and a circuit plate 43 (43a and 43b) that is provided on the other surface of the insulating plate 41 and that forms prescribed circuits.

Additionally, one end of a metal terminal 5 is electrically connected and fixed to the circuit plate 43a of the multilayer substrate 4. The other end of the metal terminal 5 protrudes out of a case 6, in which the semiconductor chips 3 and the multilayer substrate are housed. The semiconductor chips 3 and the multilayer substrate 4 are sealed inside the case 6 by an insulating material 7, such as a thermosetting resin.

In order to electrically connect the semiconductor chip 3 and the multilayer substrate 4, a source electrode formed on the top surface of the semiconductor chip 3 is connected to the circuit plate 43a of the multilayer substrate 4 by bonding wiring 108. Additionally, a gate electrode formed on the top surface of the semiconductor chip 3 is connected to the circuit plate 43b of the multilayer substrate 4 by the bonding wiring 108.

The power semiconductor module 101 shown in FIGS. 4 and 5 is a non-insulated type, since the semiconductor chips 3 are electrically connected and fixed to the metal base 2, and is also a module with low inductance. Additionally, a plurality of power semiconductor modules 101 can be used in series by stacking the same on top of each other and applying pressure. This is because the top end of the metal terminal 5 of the power semiconductor module 101 placed on a lower side is in contact with the metal base 2 of the power semiconductor module 101 placed on an upper side, thereby achieving electrical continuity. Further, the power semiconductor module 101 is structured such that when pressure is applied by stacking a plurality of modules on top of each other, stress is not applied to the semiconductor chips 3.

RELATED ART DOCUMENTS

Patent Documents

Patent Document 1: Japanese Patent Application Laid-Open Publication H1-122146

Patent Document 2: Japanese Patent Application Laid-Open Publication H6-295965

Patent Document 3: Japanese Patent Application Laid-Open Publication H7-312410

SUMMARY OF THE INVENTION

A power semiconductor module employed for a device requiring high-frequency switching is expected to have low inductance. The non-contact power semiconductor module 101 described above has low inductance, and is therefore highly suitable for such a device requiring high-frequency switching. However, since there is ongoing demand for high-speed switching in various devices, power semiconductor modules are expected to provide even lower inductance.

The present invention aims to effectively solve the problems described above, and to provide a power semiconductor module capable of achieving even lower inductance as a non-contact power semiconductor module.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power semiconductor module, including: a metal base; a semiconductor element having a first electrode and a second electrode on principal surfaces thereof, the first electrode being electrically connected and fixed to the metal base; a multilayer substrate formed by stacking together a circuit plate, an insulating plate, and a metal plate, the metal plate being fixed to the metal base; a circuit board that is provided so as to face the semiconductor element and the multilayer substrate and that has a metal film electrically connecting the second electrode of the semiconductor element to the circuit plate of the multilayer substrate; and a conductive post electrically connected and fixed to the second electrode of the semiconductor element at one end and electrically connected and fixed to the metal film of the circuit board at another end.

In another aspect, the present disclosure provides a powder semiconductor module, including: a metal base; a semiconductor element provided with a first electrode and a second electrode on principal surfaces thereof, the first electrode being electrically connected and fixed to the metal base; an multilayer substrate formed by stacking together a circuit plate, an insulating plate, and a metal plate, the metal plate being fixed to the metal base; a circuit board that is provided so as to face the semiconductor element and the multilayer substrate and that has a metal film electrically connecting the second electrode of the semiconductor element to the circuit plate of the multilayer substrate; and a conductive post electrically connected and fixed to the circuit plate of the multilayer substrate at one end and electrically connected and fixed to the metal film of the circuit board at another end.

Since, in one aspect, the power semiconductor module of the present invention is equipped with a circuit board and a conductive post, and the semiconductor element and the multilayer substrate are electrically connected by the corresponding circuit board and conductive post, it is possible to achieve an inductance that is lower than the inductance of a conventional power semiconductor module that uses bonding wiring.

It is to be understood that both the foregoing general description and the following detailed description are exemplary and explanatory, and are intended to provide further explanation of the invention as claimed.

DETAILED DESCRIPTION OF EMBODIMENTS

Embodiments of the power semiconductor module of the present invention will be described below in detail with reference to diagrams.

Embodiment 1

Figure 1A:
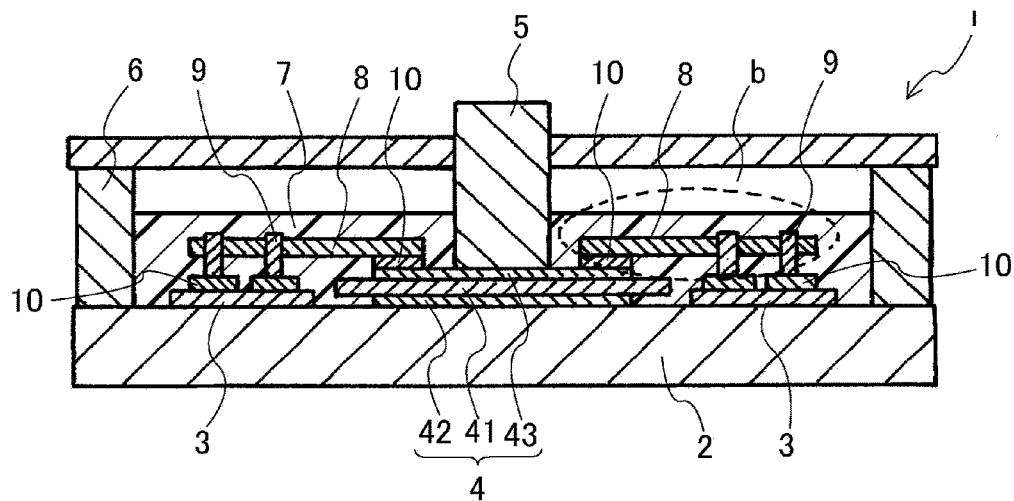
FIGS. 1A and 1B are diagrams for describing a power semiconductor module of an embodiment of the present invention.
Figure 1B:
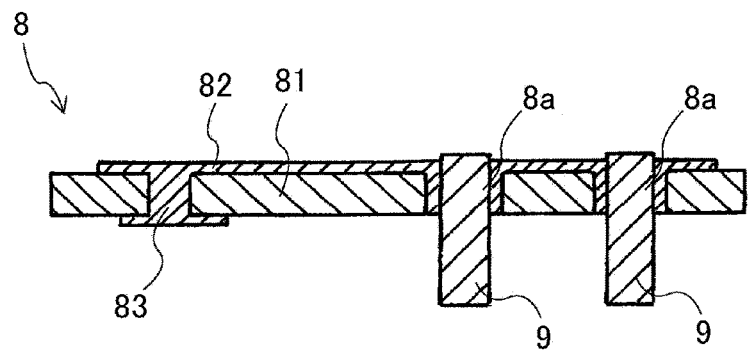

FIGS. 1A and 1B show a cross-sectional view (FIG. 1A) and an enlarged cross-sectional view (FIG. 1B) of a power semiconductor module of an embodiment of the present invention. FIG. 1A is a diagram corresponding to a cross-sectional view of a conventional power semiconductor module shown in FIG. 5.

A power semiconductor module 1 of the present embodiment shown in FIG. 1A is equipped with a metal base 2 as a conductive plate. Additionally, the power semiconductor module 1 is equipped with semiconductor chips 3, each of which has a first electrode and a second electrode on the principal surfaces thereof. The semiconductor chips 3 serve as semiconductor elements, and are fixed on the metal base 2. The semiconductor chips 3 are, specifically, IGBTs (Insulated Gate Bipolar Transistors) or power MOSFETs, for example. A power MOSFET will be used as an example below, and a case in which the first electrode formed on the bottom surface is a drain electrode and a second electrode formed on the top surface is a source electrode and a gate electrode will be described. Power MOSFETs made of silicon carbide (SiC) are capable of performing switching at a higher frequency than semiconductor chips made of silicon, and are therefore highly suitable as the semiconductor chips 3 of the power semiconductor module of the present embodiment.

Note, however, that the semiconductor elements of the present invention are not limited to IGBTs or power MOSFETs, and only need to be semiconductor elements capable of performing switching operation. In the illustrated example, a total of two semiconductor chips 3 are provided on the left and right sides of the page, and a plurality of semiconductor chips 3 are provided along the depth direction of the page. With respect to these semiconductor chips 3, the first electrode (drain electrode) formed on the bottom surface of each of the semiconductor chips 3 and the metal base 2 are joined by a conductive joining material not shown in the diagram, such as solder or a metal sintering material. This also ensures an electrical connection between the first electrode of the semiconductor chip 3 and the metal base 2.

Aside from the semiconductor chips 3, a multilayer substrate 4 is joined on the metal base 2. As shown in FIG. 1A, the multilayer substrate 4 is configured by stacking together a circuit plate 43, an insulating plate 41, and a metal plate 42. The circuit plate 43 and the metal plate 42 are joined to the multilayer substrate by a joining material not shown in the diagram, such as solder. The circuit plate 43 is constituted by circuit plates 43a and 43b, which form prescribed circuits. The insulating plate 41 is an insulating plate made of an insulating ceramic, such as aluminum nitride or aluminum oxide, for example, and the metal plate 42 and the circuit plate 43 are made of copper, for example. A DCB (Direct Copper Bond) substrate or the like formed by directly joining the insulating plate 41, the metal plate 42, and the circuit plate 43 can be used as the multilayer substrate 4.

Additionally, one end of a metal terminal 5 is electrically connected and fixed to the circuit plate 43a of the multilayer substrate 4. The other end of the metal terminal 5 protrudes out of a case 6, in which the semiconductor chips 3 and the multilayer substrate 4 are housed. The semiconductor chips 3 and the multilayer substrate 4 are sealed inside the case 6 by an insulating gel or an insulating hard resin serving as an insulating material 7. It is preferable that an insulating hard resin, in particular epoxy resin, be used as the insulating material 7, from the viewpoint of ensuring resistance to high temperature use. In the power semiconductor module 1 of the present embodiment, the metal base 2, the semiconductor chips 3, the multilayer substrate 4, the metal terminal 5, the case 6, and the insulating material 7 can be configured in the same manner as in the conventional power semiconductor module 101 shown in FIG. 4. Therefore, in the following description, FIG. 4 can be referred to for a description of the metal base 2, the semiconductor chips 3, the multilayer substrate 4, the metal terminal 5, the case 6, and the insulating material 7.

In the power semiconductor module 1 of the present embodiment, circuit boards 8 are provided to face the semiconductor chips 3 and the multilayer substrate 4. This is done to electrically connect the source electrode of the second electrode formed on the top surface of the semiconductor chip 3 with the circuit plate 43a of the multilayer substrate 4, as well as to electrically connect the gate electrode of the second electrode formed on the top surface of the semiconductor chip 3 with the circuit plate 43b of the multilayer substrate 4. The circuit board 8 is formed by forming metal layers 82 made of a conductive metal such as copper or aluminum on at least one surface of an insulating plate 81, as shown in an enlarged cross-sectional view of FIG. 1B. It is preferable that copper wiring be used for metal layers 82 to achieve low inductance. The circuit board 8 has at least two types of metal layers. One is a metal layer for electrically connecting the source electrode formed on the top surface of the semiconductor chip 3 and the circuit plate 43a of the multilayer substrate 4. The other is a metal layer for electrically connecting the gate electrode formed on the top surface of the semiconductor chip 3 and the circuit plate 43b of the multilayer substrate 4.

Through holes 8a are electrically connected to the metal layers 82 of the circuit board 8. One end of a conductive post 9 is inserted into the through hole 8a, and is joined thereto by a conductive joining material (not illustrated) such as solder. The other end of the conductive post 9 is joined to the second electrode (source electrode or gate electrode) formed on the top surface of the semiconductor chip 3 by a conductive joining material 10 such as solder.

Additionally, the metal layers 82 of the circuit board 8 and the circuit plates 43a and 43b of the multilayer substrate 4 are joined by a joining material 10 such as solder via a joining pad 83.

In the configuration described above, the circuit plate 43a of the multilayer substrate 4 is electrically connected to the source electrode of the semiconductor chip 3 via the circuit board 8, the conductive posts 9, and the joining materials 10. Additionally, the circuit plate 43b of the multilayer substrate 4 is electrically connected to the gate electrode of the semiconductor chip 3 via the circuit board 8, the conductive posts 9, and the joining materials 10. The power semiconductor module 1 of the present embodiment is configured with the circuit boards 8 and the conductive posts 9 in lieu of the bonding wiring 108 used in the conventional power semiconductor module 101 shown in FIG. 5.

Figure 5:
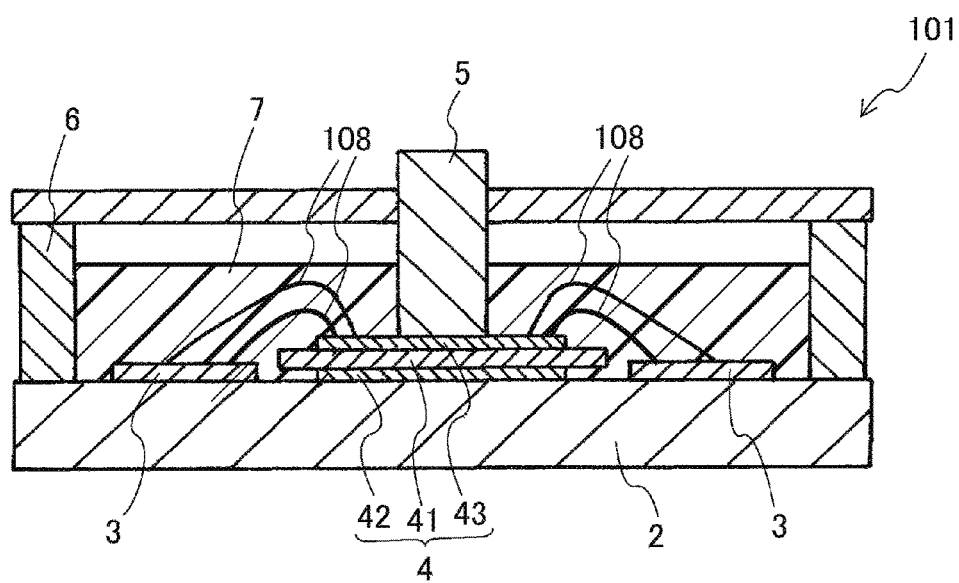
FIG. 5 is a cross-sectional view of an example of a conventional power semiconductor module.

The electrical connection using the circuit boards 8 and the conductive posts 9 in the power semiconductor module 1 of the present embodiment allows the cross section of the wiring to be thicker than the cross section of the bonding wiring 108 of the conventional power semiconductor module 101 shown in FIG. 5. Additionally, the length of wiring can be shortened. Moreover, it is possible to further lower the level of inductance by making the current from the source electrode and the current to the gate electrode flow in opposite directions in adjacent metal layers of the circuit boards 8 or in a plurality of adjacent conductive posts 9. These allow the inductance of the power semiconductor module 1 of the present embodiment to be lower than the inductance of the conventional power semiconductor module 101. Since the inductance caused by the bonding wiring 108 accounts for a large proportion of the inductance of the conventional power semiconductor module 101 as a whole, the power semiconductor module 1 of the present embodiment, which does not use the bonding wiring 108, is greatly effective in reducing inductance.

Figure 4:
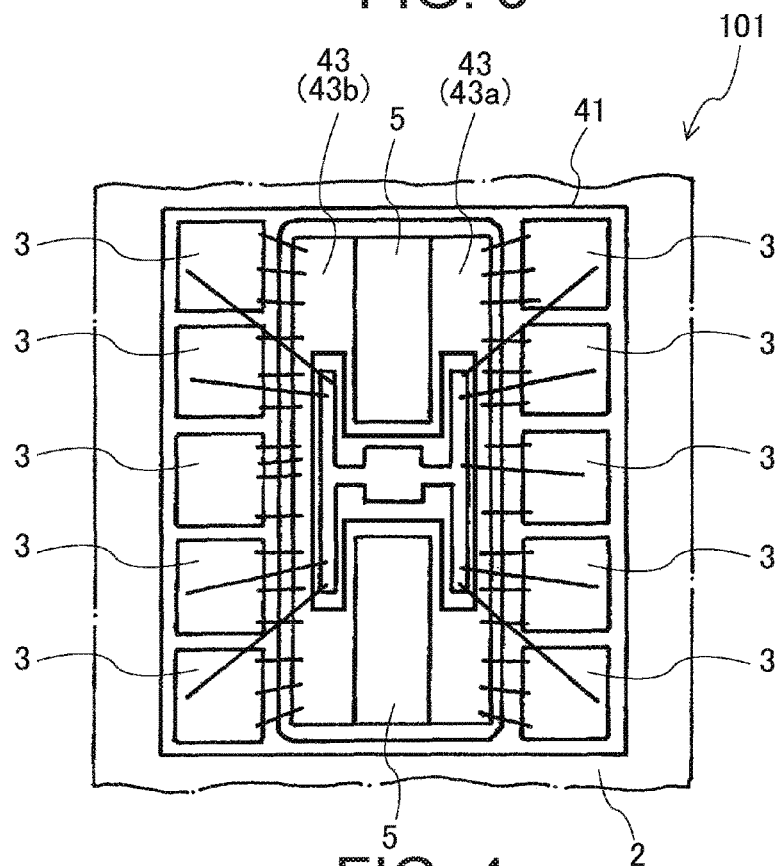
FIG. 4 is a plan view of an example of a conventional power semiconductor module.

Additionally, with respect to the wiring connected to the gates of the semiconductor chips 3, equal-length wiring, which is difficult to use for the bonding wiring 108 in the conventional example, can be used for the circuit board 8. This is because only straight wiring can be used for bonding wiring 108, as shown in FIG. 4, whereas wiring of any shape can be used when the circuit board 8 is employed. By using equal-length wiring for the gates, it becomes possible to perform switching by synchronizing a plurality of semiconductor chips 3 and thereby improve the switching property of the power semiconductor module 1.

Further, recent years have seen rising demands for smaller semiconductor chips, a larger current flow in semiconductor chips, and an increase in current density. However, it has become increasingly difficult to realize these demands with the conventional power semiconductor module 101 due to the limitations in the thinning of the bonding wiring 108, the limitations in the amount of current flow, the restrictions on the bonding device, and the like. In contrast, the power semiconductor module 1 of the present embodiment electrically connects the semiconductor chip 3 and the multilayer substrate 4 using the circuit board 8 and the conductive posts 9. For this reason, it is possible to realize the above-mentioned demands for smaller semiconductor chips, a larger current flow in semiconductor chips, and an increase in current density mentioned above, as well as easy assembly.

In addition, in the conventional power semiconductor module 101, a crack easily forms in the joining portion between the bonding wiring 108 and the semiconductor chip 3 due to repeated temperature changes of the semiconductor chip 3. Further, the bonding wiring 108 peels off from the semiconductor chip 3 in some cases. In contrast, the power semiconductor module 1 of the present embodiment is able to join the semiconductor chip 3 and the circuit board 8 in a highly reliable manner using the conductive posts 9 and the joining materials 10, thereby enhancing the reliability of the power semiconductor module 1 as a whole.

Further, in the power semiconductor module 1 of the present embodiment, the height of the package can be lower than in the conventional power semiconductor module 101, since the bonding wiring 108 is not used. For this reason, it is possible to reduce the height or the amount of the insulating material 7 filled inside the case 6. This makes it possible to lower the cost of the power semiconductor module 1, and enhance the reliability thereof.

In the power semiconductor module 1 of the present embodiment, the insulating plate 81 of the circuit board 8 may be a rigid substrate made of a glass epoxy material, a flexible substrate made of a polyimide material, or a ceramic substrate. The metal layers 82 of the circuit board 8 can be formed on one surface (top surface or bottom surface) of the insulating plate 81, or on both surfaces. In addition, the circuit board 8 has, at a portion joined with the multilayer substrate 4, a joining pad 83 such as the one shown in FIG. 1B. The joining pad 83 helps to increase the reliability of connection by increasing the area of connection between the circuit board 8 and the multilayer substrate 4, but is not a necessary component.

The conductive post 9 is made of a metal material with good conductivity, such as copper. Additionally, metal plating can be applied to the surface, if needed. The outer shape of the conductive post 9 can be, but not limited to, a cylinder, a cuboid, or the like. Note, however, that the bottom surface of the conductive post 9 must be smaller than the second electrode formed on the top surface of the semiconductor chip 3. Additionally, a higher conductive post 9 facilitates the flow of the insulating material 7 inside the case 6, and a lower conductive post 9 makes it possible to lower the height of the package of the power semiconductor module. Therefore, the height of the conductive post 9 can be determined accordingly in consideration of these requirements.

Further, any number of conductive posts 9 can be installed on each of the semiconductor chips 3, and it is also possible to join a plurality of conductive posts 9 to one electrode.

The power semiconductor module 1 uses a circuit board and with conductive posts, which are coupled together by joining the circuit board 8 and the conductive posts 9 into an integral whole. For this reason, it is possible to simplify the steps of manufacturing the power semiconductor module 1.

In the power semiconductor module 1 of the present embodiment, the height of the surface of the multilayer substrate 4 from the surface of the metal base 2 is higher than the height of the electrode on the top surface of the semiconductor chip 3 from the surface of the metal base 2. Therefore, to ensure that the circuit board 8 is disposed substantially parallel to the metal base 2 and the multilayer substrate 4, the joining material 10, not the conductive posts, is used to connect the circuit board 8 and the multilayer substrate 4 via the joining pad 83. However, by using the conductive posts 9 with different lengths, the conductive posts 9 can be used to connect not only the circuit board 8 and the semiconductor chip 3, but also the circuit board 8 and the multilayer substrate 4 while keeping the circuit board 8 parallel.

Embodiment 2

Figure 2:
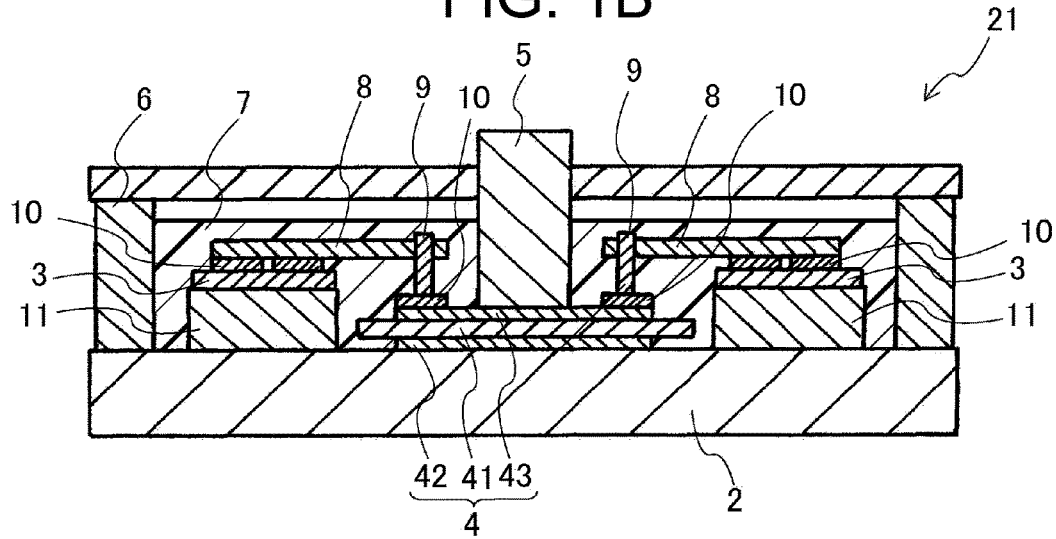
FIG. 2 is a cross-sectional view of a power semiconductor module of Embodiment 2.

FIG. 2 shows a cross-sectional view of a power semiconductor module of Embodiment 2 of the present invention. Components of a power semiconductor module 21 of the present embodiment shown in FIG. 2 that are identical to the components of the power semiconductor module 1 of Embodiment 1 shown in FIGS. 1A and 1B are given identical reference characters. Therefore, in the description of the power semiconductor module of Embodiment 2 below, duplicate descriptions of those components that are identical to the components of the power semiconductor module 1 of Embodiment 1 shown in FIGS. 1A and 1B will be omitted.

A significant difference between the power semiconductor module 21 of Embodiment 2 shown in FIG. 2 and the power semiconductor module 1 of Embodiment 1 shown in FIG. 1A is that, in the power semiconductor module 21, a metal block 11 is provided between a metal base 2 and a semiconductor chip 3, so as to achieve electrical continuity between the semiconductor chip 3 and the metal base 2 via the metal block 11. The metal block 11 is joined to both the metal base 2 and the semiconductor chip 3 using conductive joining materials not shown in the diagram.

The metal block 11 is made of a metal material having a coefficient of thermal expansion between the coefficient of thermal expansion of the metal base 2 and the coefficient of thermal expansion of the semiconductor chip 3, such as molybdenum. By providing the metal block 11 such as the one described above, it is possible to effectively prevent an occurrence of flaws such as a crack in the joining material between the metal base 2 and the semiconductor chip 3, caused by the difference in thermal expansion when the semiconductor chip 3 heats up.

In the power semiconductor module 21, the height of the surface of an multilayer substrate 4 from the surface of the metal base 2 is lower than the height of the electrode on the top surface of the semiconductor chip 3 from the surface of the metal base 2. Therefore, to ensure that the circuit board 8 is disposed substantially parallel to the metal base 2 and the multilayer substrate 4, a conductive post 9 is used to join the circuit board 8 and the multilayer substrate 4. The circuit board 8 is joined to the semiconductor chip 3 by joining materials 10, not conductive posts, via a joining pad 83.

Additionally, in a modification example of Embodiment 2 of the present invention, the height of the metal block 11 can be lower than the height shown in FIG. 2, so that the height of the surface of the multilayer substrate 4 from the surface of the metal base 2 is higher than the height of the electrode on the top surface of the semiconductor chip 3 from the surface of the metal base 2. In this case, in a manner similar to Embodiment 1, conductive posts can be used to connect the circuit board 8 and the semiconductor chip 3, and the circuit board 8 can be joined to the multilayer substrate via a joining pad. In sum, the height of the electrode on the top surface of the semiconductor chip from the surface of the metal base 2 and the height of the surface of the multilayer substrate 4 from the surface of the metal base 2 can be compared so that the conductive posts 9 are employed for the lower one.

Embodiment 3

Figure 3:
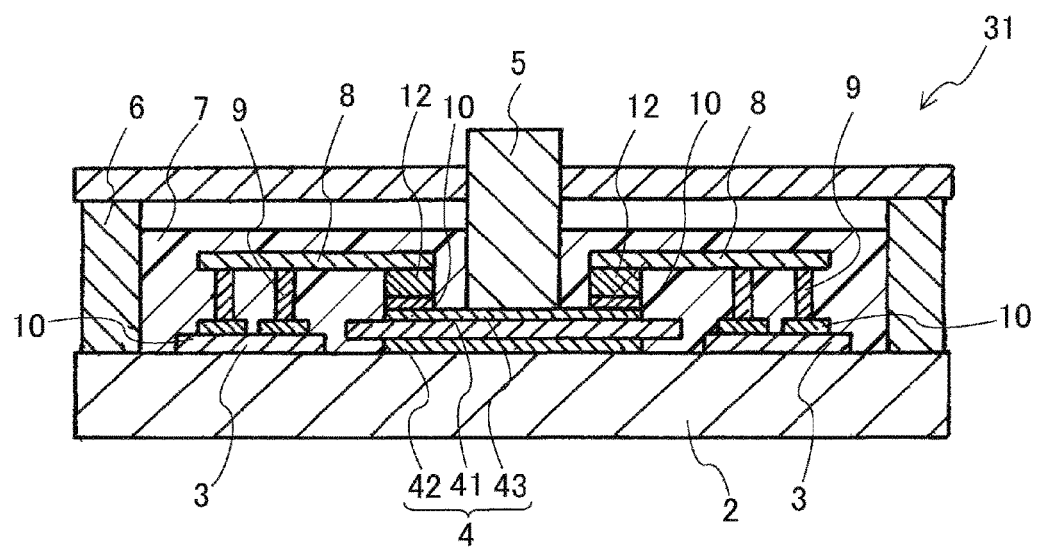
FIG. 3 is a cross-sectional view of a power semiconductor module of Embodiment 3.

FIG. 3 shows a cross-sectional view of a power semiconductor module of Embodiment 3 of the present invention. Components of a power semiconductor module 31 of the present embodiment shown in FIG. 3 that are identical to the components of the power semiconductor module 1 of Embodiment 1 shown in FIGS. 1A and 1B are given identical reference characters. Therefore, in the description of the power semiconductor module of Embodiment 3 below, duplicate descriptions of those components that are identical to the components of the power semiconductor module 1 of Embodiment 1 shown in FIGS. 1A and 1B will be omitted.

When the power semiconductor module in one aspect of the present invention is manufactured, an insulating material 7 may not be filled sufficiently between an multilayer substrate 4 and a circuit board 8 if the space between the multilayer substrate 4 and the circuit board 8 is narrow, depending on the viscosity of the insulating material 7 used. To solve this issue, the circuit board 8 is disposed farther away from the multilayer substrate 4 in the power semiconductor module 31 of Embodiment 3 than in the power semiconductor module 1 shown in FIG. 1A. Since the circuit board 8 is provided farther away from the multilayer substrate 4, it is possible to improve the filling of the insulating material 7.

In the power semiconductor module 31 shown in FIG. 3, the circuit board 8 is joined to conductive posts 9 closer to an end of the long direction of each of the conductive posts 9 than in the power semiconductor module 1. Alternatively, the conductive posts 9 that are longer than the conductive posts shown in FIG. 1A are used, and the circuit board 8 is joined to the conductive posts 9 at an end of each of the conductive posts 9. Further, a metal block 12 is provided between a circuit plate 43 of the multilayer substrate 4 and the circuit board 8, and electrical continuity is achieved between the circuit plate 43 of the multilayer substrate and the circuit board 8 via the metal block 12 and the joining materials 10. The metal block 12 is joined to the circuit board 8 by a conductive joining material not shown in the diagram.

The metal block 12 is made of a metal with good conductivity such as copper. By providing the metal block 12, it is possible to place the circuit board 8 substantially parallel to a metal base 2 and the multilayer substrate 4.

The power semiconductor module according to various aspects of the present invention has been described in detail above using diagrams and embodiments, but the present invention is not limited to the above embodiments and diagrams, and can be implemented by appropriately modifying the above embodiments without departing from the spirit thereof.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A power semiconductor module, comprising:
a metal base;
a semiconductor element on the metal base, the semiconductor element having a first electrode on a bottom surface and a second electrode on a top surface thereof, said first electrode being electrically connected and fixed to said metal base;
a multilayer substrate on the metal base, placed side-by-side with the semiconductor element, the multilayer substrate being formed by stacking together a circuit plate, an insulating plate, and a metal plate, said metal plate being fixed to said metal base;
a circuit board that is provided so as to face said semiconductor element and said multilayer substrate and that has a metal film electrically connecting the second electrode of said semiconductor element to the circuit plate of said multilayer substrate; and
a conductive post electrically connected and fixed to the second electrode of said semiconductor element at one end and electrically connected and fixed to the metal film of said circuit board at another end,
wherein the circuit plate of said multilayer substrate and the metal film of the circuit board are connected via a solder that directly contacts the circuit plate and the metal film or via a solder and a metal block that are interposed between the circuit plate and the metal film.

2. The power semiconductor module according to claim 1, wherein said semiconductor element is made of silicon carbide.

3. The power semiconductor according to claim 1, further comprising a case housing said semiconductor element and said multilayer substrate, said semiconductor element and said multilayer substrate inside said case being sealed by a thermosetting resin.

4. The power semiconductor according to claim 1, further comprising:
a case housing said semiconductor element and said multilayer substrate; and
a metal terminal that is electrically connected to the circuit plate of said multilayer substrate and that protrudes out of said case.

5. A power semiconductor module, comprising:
a metal base;
a semiconductor element on the metal base, the semiconductor element having a first electrode on a bottom surface and a second electrode on a top surface thereof, said first electrode being electrically connected and fixed to said metal base;
a multilayer substrate on the metal base, placed side-by-side with the semiconductor element, the multilayer substrate being formed by stacking together a circuit plate, an insulating plate, and a metal plate, said metal plate being fixed to said metal base;
a circuit board that is provided so as to face said semiconductor element and said multilayer substrate and that has a metal film electrically connecting the second electrode of said semiconductor element to the circuit plate of said multilayer substrate; and
a conductive post electrically connected and fixed to the circuit plate of said multilayer substrate at one end and electrically connected and fixed to the metal film of said circuit board at another end,
wherein said metal base is connected to the first electrode of said semiconductor element via a metal block and a solder that are interposed between the metal base and the first electrode.

6. The power semiconductor module according to claim 5, wherein said semiconductor element is made of silicon carbide.

7. The power semiconductor according to claim 5, further comprising a case housing said semiconductor element and said multilayer substrate, said semiconductor element and said multilayer substrate inside said case being sealed by a thermosetting resin.

8. The power semiconductor according to claim 5, further comprising:
a case housing said semiconductor element and said multilayer substrate; and
a metal terminal that is electrically connected to the circuit plate of said multilayer substrate and that protrudes out of said case.

* * * * *